United States Patent [19]

Rubin

[11] Patent Number: 4,609,320
[45] Date of Patent: Sep. 2, 1986

[54] FLEXIBLE WORKPIECE TRANSPORTER AND ROLLER ASSEMBLY THEREFOR

[76] Inventor: Richard H. Rubin, 159 C Meriline Ave., West Paterson, N.J. 07424

[21] Appl. No.: 622,675

[22] Filed: Jun. 20, 1984

[51] Int. Cl.[4] ............................................. B65H 1/00
[52] U.S. Cl. ..................................... 414/225; 198/346.2; 198/468.4; 198/842; 226/190; 242/76; 384/546; 414/752; 901/19
[58] Field of Search .............. 414/662, 663, 225, 752, 414/728, 331; 384/546, 587; 242/76; 226/190, 194, 168; 254/413, 416; 250/328; 198/485, 486, 339, 341, 345, 346.2, 842, 468.4, 468.9; 474/19; 901/19

[56] References Cited

U.S. PATENT DOCUMENTS

| 1,500,516 | 7/1924 | Morton | 384/546 |
|---|---|---|---|
| 3,393,849 | 7/1968 | Hass | 226/194 |
| 3,823,836 | 7/1974 | Cheney et al. | 414/225 |
| 3,919,554 | 11/1975 | Frank | 250/328 |
| 4,062,463 | 12/1977 | Hillman et al. | 414/225 |
| 4,122,936 | 10/1978 | Johnson | 198/339 |
| 4,312,618 | 1/1982 | Greene | 414/225 |
| 4,378,189 | 3/1983 | Takeshita et al. | 414/225 |
| 4,501,527 | 2/1985 | Jacoby et al. | 414/225 |

FOREIGN PATENT DOCUMENTS 222901 10/1968 Sweden ........................... 414/728

Primary Examiner—Joseph E. Valenza
Assistant Examiner—David A. Bucci

[57] ABSTRACT

A flexible workpiece transporter is provided with a guide roller adapted to move laterally with the flexible workpiece transporter to thereby inhibit chafing of the guide roller as a result of the lateral movement of the transporter relative to the guide roller. Chafing of the guide roller can be further inhibited by providing the guide roller with ends which are tapered so as to contact a relatively smooth upper surface of the transporter rather than a pair of relatively sharp longitudinal edges thereof.

22 Claims, 2 Drawing Figures

FLEXIBLE WORKPIECE TRANSPORTER AND ROLLER ASSEMBLY THEREFOR

FIELD OF THE INVENTION

The present inventin relates to a flexible workpiece transporter, and, more particularly, to a new and improved guide roller assembly therefor.

BACKGROUND OF THE INVENTION

In copending U.S. patent application Ser. No. 613,108, filed May 23, 1984, which is entitled "Module Processing Apparatus and Modules for Use Therewith" and which is owned by the assignee of the present invention and application, there is disclosed a unique load module which employs a flexible load arm. More particularly, the load arm is made from hardened steel having a concave cross-sectional shape. A system of rollers is utilized to bend and guide the load arm as it is extended and retracted during the transportation of a workpiece, such as a silicon wafer, from one location to another. One roller in particular (i.e., a guide roller) functions to maintain the load arm horizontal and level.

Because the longitudinal edges of the load arm, which edges are relatively sharp due to the thinness of the load arm and its metal construction, are in constant contact with the guide roller, the load arm causes chafing of the guide roller, especially if the load arm moves laterally relative to the guide roller during the extension and retraction of the load arm. Such chafing of the guide roller is disadvantageous because it shortens the operating life of the guide roller, thereby necessitating its rather frequent replacement.

SUMMARY OF THE PRESENT INVENTION

The problems and disadvantages discussed above are overcome in accordance with the present invention by providing a laterally movable guide roller for a flexible workpiece transporter, such as the one employed by the load module disclosed in the copending U.S. patent application referred to above. In one embodimemt of the invention, such lateral movement of the guide roller is achieved by mounting the guide roller in a pair of linear bearings.

Because the guide roller is movable laterally, it can move conjointly with the load arm if the load arm moves laterally during its extension and retraction, thereby substantially inhibiting chafing of the guide roller by the load arm. In order to further inhibit chafing of the guide roller by the load arm, the ends of the guide roller which contact the load arm are tapered so that they do not directly contact the relatively sharp longitudinal edges of the load arm but rather contact a relatively smooth curved upper surface of the load arm.

BRIEF DESCRIPTION OF THE DRAWINGS

For a more complete understanding of the present invention, reference is made to the following detailed description of the invention considered in conjunction with the accompanying drawings, in which.

DETAILED DESCRIPTION OF THE EXEMPLARY EMBODIMENT

Although the present invention is suitable for use in connection with many different types of flexible transportation systems for workpieces in general, it is especially suited for use in connection with a load module of a wafer processing apparatus such as the one disclosed in copending U.S. patent application Ser. No. 613,108, filed May 23, 1984, which is entitled "Module Processing Apparatus and Modules for Use Therewith" and which is owned by the assignee of the present invention and application. Accordingly, the present invention will be described in combination with the load module described and illustrated in the above-identified copending U.S. patent application, the specification of which is incorporated herein by reference.

Figure 1:
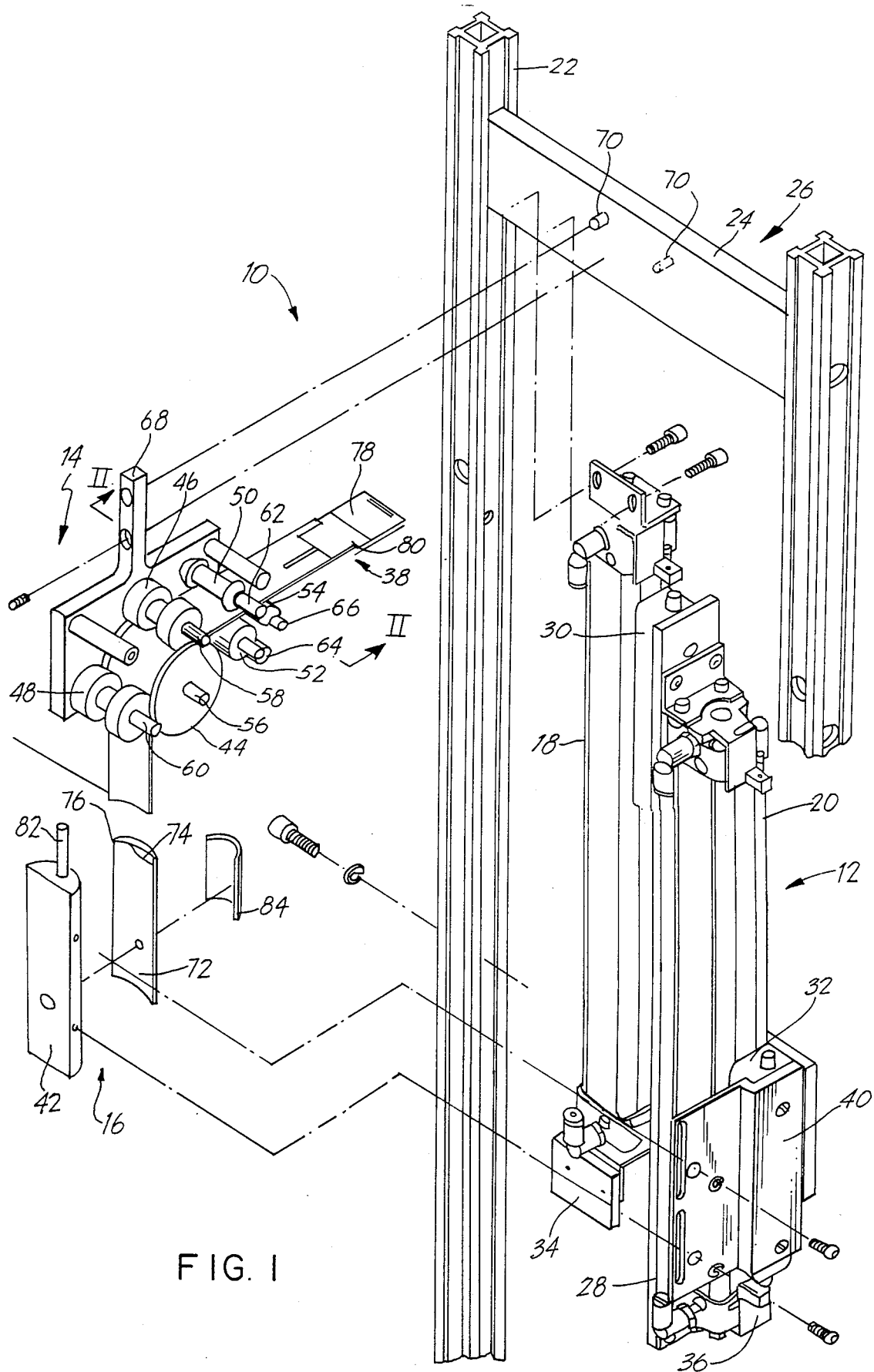
FIG. 1 is an exploded view of a load module which employs a flexible workpiece transporter and a guide roller assembly constructed in accordance with an exemplary embodiment of the present invention.

With reference to FIG. 1, there is shown a load module 10 which includes three basic subassemblies. These subassemblies are a cylinder subassembly 12, a roller subassembly 14 and a load arm subassembly 16.

The cylinder subassembly 12 includes one fixed band cylinder 18 and one movable band cylinder 20. The fixed cylinder 18 is attached to a corner column 22 and a stringer 24 of a chassis 26 for the wafer processing apparatus (not shown) referred to above. The movable cylinder 20 is attached to a plate 28, which is screwed to a piston 30 of the fixed cylinder 18. The movable cylinder 20 has a piston 32.

Combined movement of both of the cylinders 18, 20 will move a wafer from a cassette (not shown) to a chuck module (not shown). More particularly, the movable cylinder 20 is adapted to move the wafer from the cassette to a hot plate module (not shown), while the fixed cylinder 18 is adapted to transport the wafer from the hot plate module to the chuck module.

There are brackets 34, 36 at the ends of the cylinders 18, 20, respectively. The brackets 34, 36 mount sensors (not shown). Another sensor (not shown) is mounted on a bracket attached to the plate 28 which holds the movable cylinder 20. When this sensor is activated, vacuum on a load arm 38 of the load arm subassembly 16 is shutoff so that the wafer which is being transported by the load arm 38 can be dropped off in the cassette.

The cylinder subassembly 12 also includes a standoff 40 and an adapter slide 42. The standoff 40 is attached to the piston 32 of the movable cylinder 20, while the adapter slide 42 is attached to the standoff 40. The adapter slide 42 is adjustable up and down for different size wafers.

The roller subassembly 14 includes rollers 44, 46, 48, 50, 52, 54 which are made from a plastic material such as nylon. Each of the rollers 44, 46, 48, 50, 52, 54 has its own shaft 56, 58, 60, 62, 64, 66, respectively. There are two roller plates 68 (only one of which is shown in FIG. 1) cooperating to sandwich the rollers 44, 46, 48, 50, 52, 54 therebetween. Each of the roller plates 68 has radial bearings (not shown in FIG. 1) to receive the shafts 56, 58, 60, 64, 66. Snap rings (not shown in FIG. 1) are inserted on the ends of the shafts 56, 58, 60, 64, 66 in order to hold them in place. So as to hold the roller subassembly 14 rigid and square, three standoffs (not shown) are provided between the corners of the roller plates 68. The flanged roller 44 is surrounded by the floating rollers 46, 48, which support and guide the flexible load arm 38 of the load arm subassembly 16 at the bending point of the load arm 38. The rollers 50, 52 are the guide and level rollers, the roller 50 being primarily responsible for maintaining the load arm 38 horizontal and level. The roller 54 gives the load arm 38 extra support when it is fully extended. The roller subassembly 14 is aligned by pins 70 and screwed to the stringer 24.

The load arm 38 of the load arm subassembly 16 includes three pieces of hardened steel 72, 74, 76, which have a concave cross-sectional shape, and a head 78. The three pieces of steel 72, 74, 76 are laid one on top of the other. A fitting 80 is positioned at the end of the load arm 38 so as to receive vacuum tubing 82. The load arm 38 is fed between the rollers 44, 46, 48, 50, 52, 54 and down to the adapter slide 42, where a clamp 84 attaches the load arm 38 to the adapter slide 42. The load arm 38 slides back and forth through the rollers 44, 46, 48, 50, 52, 54 as the pistons 30, 32 of the cylinders 18, 20 move up and down. The vacuum tubing 82 is attached to a vacuum supply (not shown) through the adapter slide 42.

Figure 2:
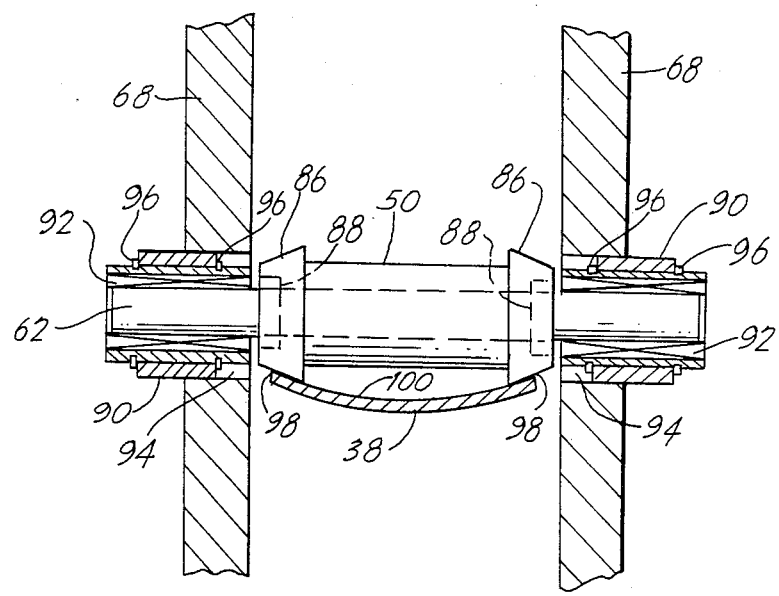
FIG. 2 is a cross-sectional view, taken along line II—II of FIG. 1 and looking in the direction of the arrows, of the guide roller assembly shown in FIG. 1.

Referring now to FIG. 2, the guide roller 50, which includes a pair of tapered ends 86, is mounted for rotation about the shaft 62. Radial bearings 88 are provided between the guide roller 50 and the shaft 62 to facilitate the rotation of the guide roller 50 about the shaft 62. The shaft 62 is mounted in the plates 68 by support sleeves 90 and linear bearings 92 which are received in openings 94 provided in the plates 68. The linear bearings 92, which are held in place by snap rings 96, function to permit the shaft 62 and the guide roller 50 to move laterally relative to the plates 68. Alternatively, the guide roller 50 can move laterally independently of the shaft 62.

The load arm 38 has longitudinal edges 98 which, due to the thinness of the load arm 38 and its metal construction, are relatively sharp compared to an upper surface 100 of the load arm 38 which, due to the concave cross-sectional shape of the load arm 38, is relatively smooth. During the extension and retraction of the load arm 38, the tapered ends 86 of the guide roller 50 are in constant rolling engagement with the relatively smooth upper surface 100 of the load arm 38 rather than with the relatively sharp longitudinal edges 98 of the load arm 38, thereby inhibiting chafing of the guide roller 50 by the load arm 38. Chafing of the guide roller 50 by the load arm 38 is further inhibited because the linear bearings 92 allow the guide roller 50 to move in a lateral direction conjointly with the load arm 38. If such lateral movement of the guide roller 50 were not permitted, the load arm 38 would, during its lateral movement relative to the guide roller 50, ride up one of the tapered ends 86 of the guide roller 50, thereby causing the load arm 38 to assume a tilted orientation. Accordingly, the lateral movement of the guide roller 50 also functions to maintain the load arm 38 level.

It will be understood that the embodiment described herein is merely exemplary and that a person skilled in the art may make many variations and modifications without departing from the spirit and scope of the invention. For instance, even if the guide roller 50 had non-tapered ends, the lateral movement of the guide roller 50 would inhibit chafing of the guide roller 50 by the load arm 38. All such modifications and variations are intended to be included within the scope of the invention as defined in the appended claims.

I claim:

1. A workpiece transporter, comprising flexible transporting means for transporting a workpiece from one location to another location, said transporting means including a metal band having relatively sharp longitudinal edges and a concave cross-sectional shape, said metal band being extendable and retractable between said locations, guiding means for guiding said metal band during its extension and retraction, said guiding means including a roller having a central portion out of contact with said metal band and a pair of tapered ends sized and shaped so as to contact a relatively smooth upper surface of said metal band but not said relatively sharp longitudinal edges of said metal band, and mounting means for mounting said guiding means such that said roller is movable in a lateral direction conjointly with said metal band, whereby chafing of said roller by said relatively sharp longitudinal edges of said metal band is inhibited by inhibiting said metal band from moving laterally relative to said roller.

2. A workpiece transporter according to claim 1, wherein said roller is made from a plastic material.

3. A workpiece transporter according to claim 2, wherein said plastic material is nylon.

4. A workpiece transporter according to claim 1, wherein said mounting means includes a pair of linear bearings.

5. A workpiece transporter according to claim 1, wherein said guiding means maintains said transporting means horizontal and level.

6. A workpiece transporter according to claim 1, further comprising supplying means for supplying a vacuum to said metal band so as to maintain a workpiece thereon during the extension and retraction of said metal band.

7. A workpiece transporter according to claim 4, wherein said mounting means includes a shaft about which said roller rotates.

8. A workpiece transporter according to claim 7, wherein said roller moves laterally together with said shaft.

9. A workpiece transporter according to claim 7, wherein said roller moves laterally independently of said shaft.

10. A workpiece transporter according to claim 1, wherein said central portion of said roller has a first diameter.

11. A workpiece transporter according to claim 10, wherein each of said tapered ends of said roller tapers from a second diameter to a third diameter, said second diameter being greater than said first and third diameters.

12. A workpiece transporter according to claim 11, wherein the portion of each tapered end having said second diameter is adjacent to said central portion of said roller and the portion of each tapered end having said third diameter is remote from said central portion of said roller.

13. In a roller assembly adapted for use in combination with a flexible, extendable and retractable load arm made from a metal band having relatively sharp longitudinal edges and a concave cross-sectional shape, the improvement comprising a roller having a central portion out of contact with the load arm and a pair of tapered ends sized and shaped so as to contact a relatively smooth upper surface of said metal band but not the relatively sharp longitudinal edges thereof and mounting means for mounting said roller such that said roller is movable in a lateral direction conjointly with the load arm, whereby chafing of said roller by the relatively sharp longitudinal edges of the load arm is inhibited by inhibiting the load arm from moving laterally relative to said roller.

14. A roller assembly according to claim 13, wherein said roller is made from plastic material.

15. A roller assembly according to claim 14, wherein said plastic material is nylon.

16. A roller assembly according to claim 13, wherein said mounting means includes a pair of linear bearings.

17. A roller assembly according to claim 16, wherein said mounting means includes a shaft about which said roller rotates.

18. A roller assembly according to claim 17, wherein said roller moves laterally together with said shaft.

19. A roller assembly according to claim 17, wherein said roller moves laterally independently of said shaft.

20. A roller assembly according to claim 13, wherein said central portion of said roller has a first diameter.

21. A roller assembly according to claim 20, wherein each of said tapered ends of said roller tapers from a second diameter to a third diameter, said second diameter being greater than said first and third diameters.

22. A roller assembly according to claim 21, wherein the portion of each tapered end having said second diameter is adjacent to said central portion of said roller and the portion of each tapered end having said third diameter is remote from said central portion of said roller.

* * * * *